United States Patent
Erell et al.

(10) Patent No.: US 7,149,685 B2
(45) Date of Patent: Dec. 12, 2006

(54) AUDIO SIGNAL PROCESSING FOR SPEECH COMMUNICATION

(75) Inventors: Adoram Erell, Herzliya (IL); Avi Kleinstein, Holon (IL)

(73) Assignee: Intel Corporation, Santa Clara, CA (US)

( * ) Notice: Subject to any disclaimer, the term of this patent is extended or adjusted under 35 U.S.C. 154(b) by 4 days.

(21) Appl. No.: 10/934,059

(22) Filed: Sep. 3, 2004

(65) Prior Publication Data

US 2005/0027526 A1 Feb. 3, 2005

Related U.S. Application Data

(63) Continuation of application No. 09/851,399, filed on May 7, 2001, now Pat. No. 6,820,054.

(51) Int. Cl.
*G10L 19/14* (2006.01)

(52) U.S. Cl. .................. 704/233; 704/226

(58) Field of Classification Search .......... None
See application file for complete search history.

(56) References Cited

U.S. PATENT DOCUMENTS

| | | | |
|---|---|---|---|
| 4,609,788 A | 9/1986 | Miller et al. | |
| 4,611,342 A | 9/1986 | Miller et al. | |
| 4,628,529 A | 12/1986 | Borth et al. | |
| 5,303,308 A | 4/1994 | Larsen et al. | |
| 5,890,109 A | 3/1999 | Walker et al. | |
| 5,903,819 A | 5/1999 | Romesburg | |
| 5,907,823 A | 5/1999 | Sjoberg et al. | |
| 5,978,756 A | 11/1999 | Walker et al. | |
| 6,212,273 B1 | 4/2001 | Hemkumar et al. | |
| 6,262,943 B1 | 7/2001 | Clarke | |
| 6,535,846 B1 | 3/2003 | Shashoua | |
| 6,708,146 B1 | 3/2004 | Sewall et al. | |
| 6,754,337 B1 | 6/2004 | Domer et al. | |
| 6,820,054 B1 * | 11/2004 | Erell et al. ................... | 704/233 |
| 6,959,275 B1 | 10/2005 | Erell | |
| 7,089,181 B1 | 8/2006 | Erell | |
| 2001/0012997 A1 | 8/2001 | Erell | |
| 2002/0019733 A1 | 2/2002 | Erell | |
| 2002/0077813 A1 | 6/2002 | Erell | |
| 2003/0002659 A1 | 1/2003 | Erell | |
| 2003/0004712 A1 | 1/2003 | Erell | |
| 2003/0023433 A1 | 1/2003 | Erell et al. | |

FOREIGN PATENT DOCUMENTS

| | | |
|---|---|---|
| DE | 94 21 650 U1 | 7/1996 |
| EP | 0 600 164 | 6/1994 |
| EP | 0 763 888 | 3/1997 |
| WO | WO 00/60830 | 10/2000 |

OTHER PUBLICATIONS

Schneider, A., et al., "An adaptive dynamic range controller for digital audio", *IEEE/Communications, Computers and Signal Processing*, pp. 339-342, May 1991 (XP010039446).

* cited by examiner

*Primary Examiner*—Susan McFadden
(74) *Attorney, Agent, or Firm*—Fish & Richardson P.C.

(57) ABSTRACT

A device receives a signal that includes human-interpretable audio information. The device detects sound locally and analyzes it to determine if an intermittent component is present. If the intermittent component is present, the received signal is altered so that the audio information is more easily human-interpretable when the signal is performed. The device can be a portable telephone. The intermittent component can be detected, for example, in music.

33 Claims, 6 Drawing Sheets

AUDIO SIGNAL PROCESSING FOR SPEECH COMMUNICATION

CROSS-REFERENCE TO RELATED APPLICATIONS

This application is a continuation application of and claims priority to U.S. application Ser. No. 09/851,399, filed on May 7, 2001 now U.S. Pat. No. 6,820,054.

BACKGROUND

This invention relates to audio signal processing for speech communication.

In typical speech communication over wire or wireless communication networks, ambient noise in the vicinity of a listener at one location can obscure speech received from a speaker at another location.

DETAILED DESCRIPTION

Figure 1:
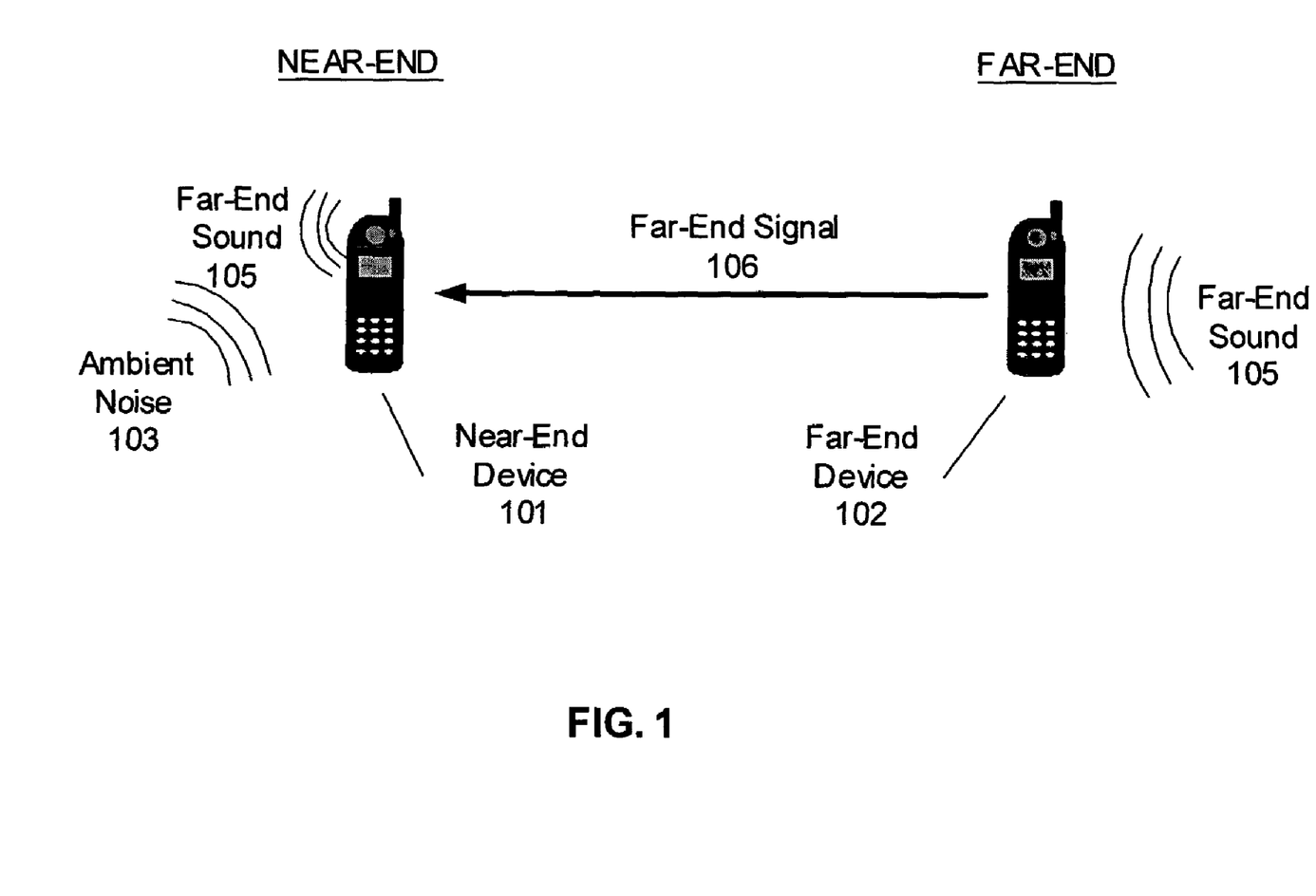
FIG. 1 is a schematic of a communication path for speech.

Referring to the example in FIG. 1, a far-end device 102 detects far-end sound 105 that can include speech. The sound 105 is converted to a signal 106, the far-end signal, which is transmitted to the near-end device 101, for example, by modulating a radio frequency signal, interfacing with a network such as the Internet, or sending a signal on a waveguide. The transmission of the signal 106 can also include combinations of known signal transmission modes, such as those that use electric, optical, microwave, infrared, and radio signals, and any number of intermediaries, such as switches, computer servers, and satellites.

The near-end device 101 reproduces the far-end sound 105. The near-end device 101 also detects near-end sound that can include ambient noise 103. The near-end device 101 processes the signal 106 in response to the ambient noise 103 in order to render the far-end sound 105 more human-interpretable to a user of the near-end device 101.

In the example depicted in FIG. 1, the near-end device 101 is a handheld telephone that receives the far-end signal 106 from the far-end device 102 which is a telephone at a remote location.

Figure 2:
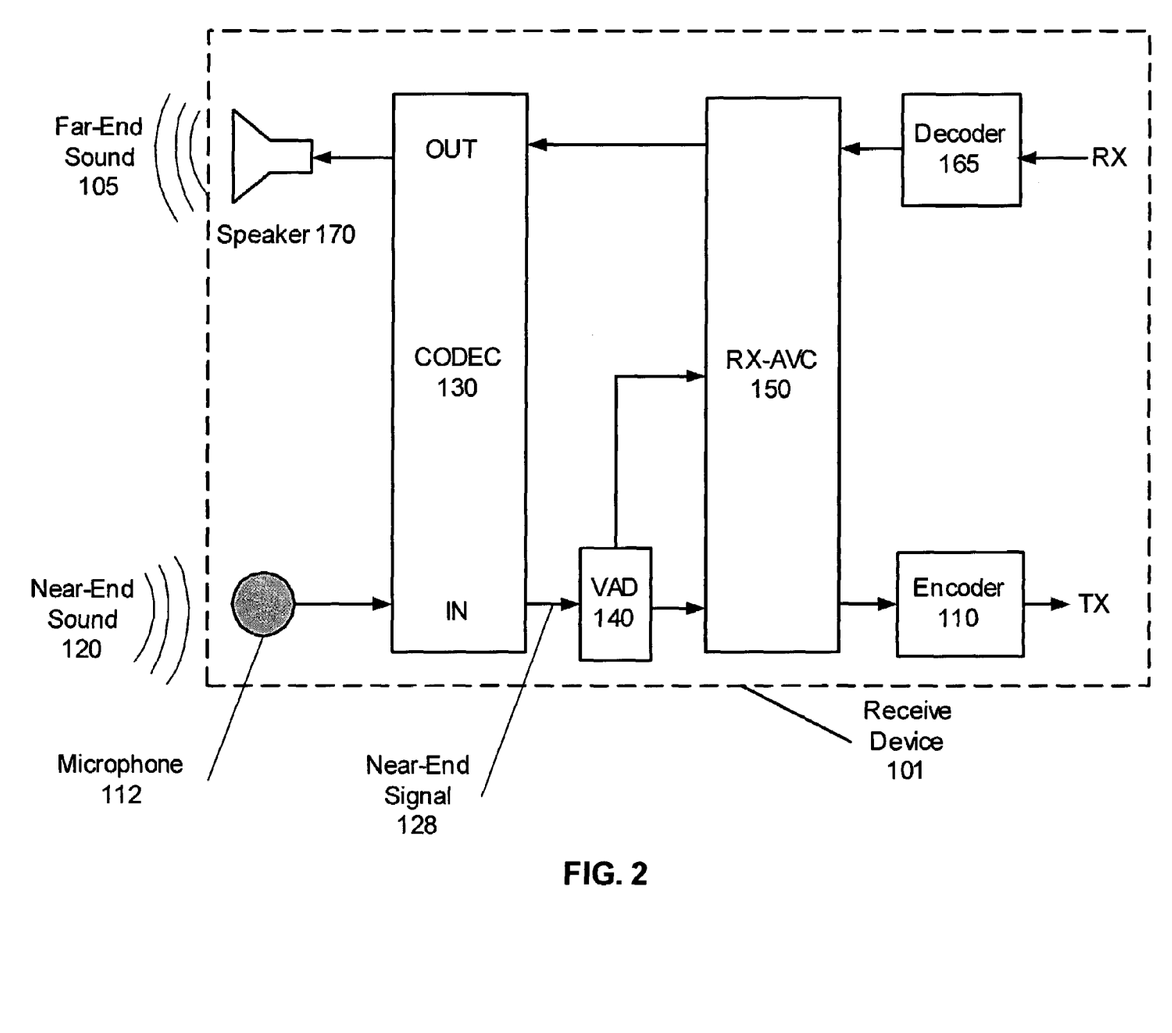
FIG. 2 is a schematic of the near-end device 101.

Referring also to the example in FIG. 2, the near-end device 101 uses a microphone 112 to detect sound 120 on the near-end. An analog signal for the near-end sound 120 can be converted into a digital signal 128 by a processor, CODEC 130. The digital signal 128 is evaluated by a voice activity detector (VAD) 140, and by a receive signal automatic volume control (RX-AVC) module 150. The RX-AVC module 150 monitors the near-end signal 128 for particular components, e.g., using a periodicity detector 157. The RX-AVC module 150 can also have a noise estimator 156 for providing an estimate of noise in the signal. The noise estimator can be controlled by triggers from the VAD 140 and the periodicity detector 157. Values from the noise estimator 156 are used by a dynamic range controller (DRC) 155 to alter the far-end signal 106.

The digital signal 128 for the near end sound 120 can be encoded by the encoder 110 for transmission (TX) to the far-end device 102.

The near-end device 101 receives the signal 106 for the far-end sound 105 at a receiver (RX). The signal 106 is decoded by the decoder 145 and analyzed by a receive path voice activity detector (RX-VAD) 162. The decoded signal 106 is modulated by the DRC module 155, e.g., to adjust the signal in the response to noise estimates from the noise estimator 156 and flags from the RX-VAD 162. The adjusted signal is converted to an analog signal by CODEC 130 and rendered as sound by the speaker 170.

Figure 3:
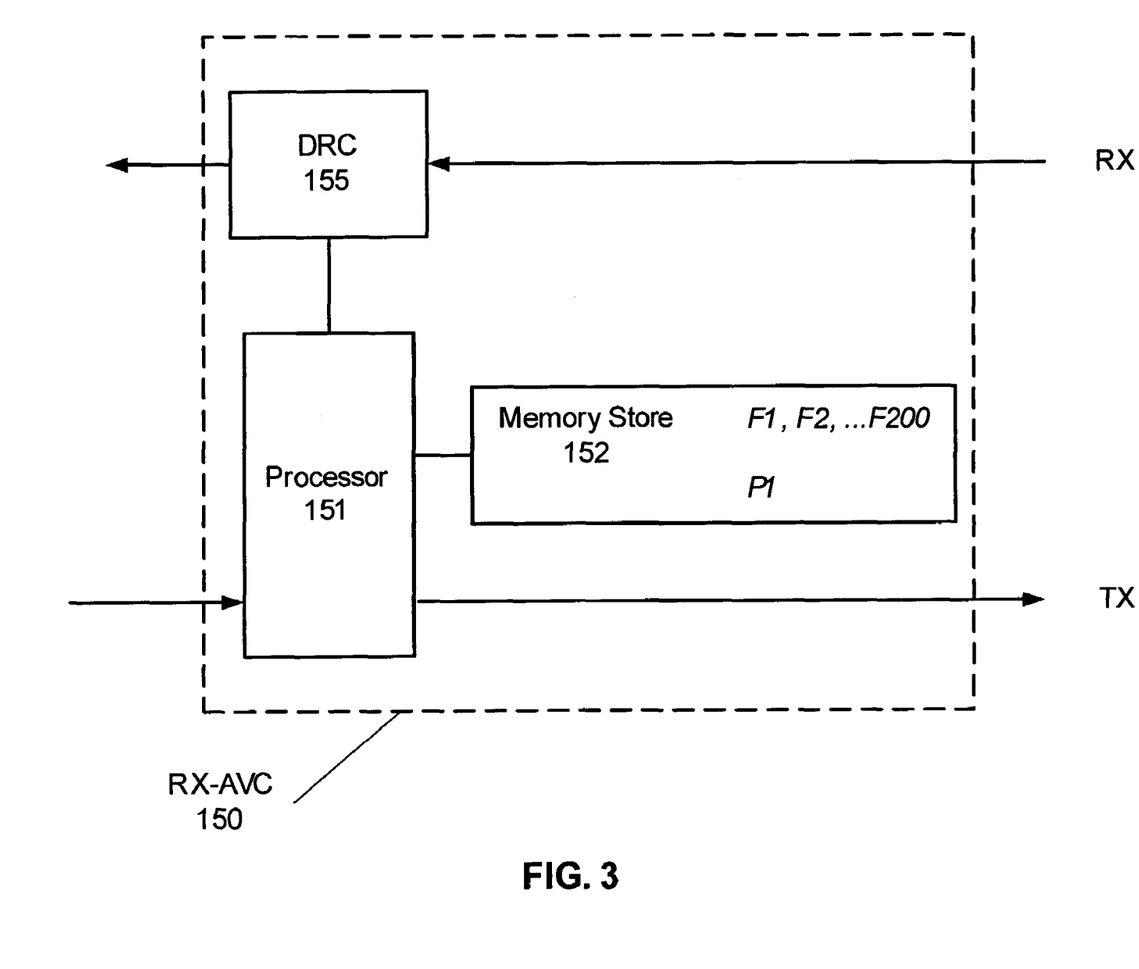
FIG. 3 is a schematic of the RX-AVC module 150.

Referring also to FIG. 3, the noise estimator 156 and periodicity detector 157 can be implemented using a RX-AVC processor 151. The RX-AVC processor 151 analyzes the signal for components that are other than a component of interest. Such components can include forms of ambient noise that are not detected by the VAD 140, for example, forms of noise which are not stationary or which are periodic such as music. The component of interest is typically human speech. The RX-AVC module 150 controls the level and dynamic range of the far-end sound 105 as a function of the detected noise 103, for example, by communicating an estimate of noise at the near-end 103, drc_noise_estimate, to the DRC 155.

The RX-AVC processor 151 can store information about the near-end signal 128 for later analysis. For example, the processor 151 can be configured to execute a frame energy sampling routine that updates a static memory buffer 152 with information about the energy of each newly received signal frame (e.g., frames F1, F2, . . . , F200) for the near-end signal 128. The routine can rewrite information about frame energies that are outside of the averaging segment 210 with the new information and update a pointer P1 to indicate the location of the new information in the static memory 152.

To reduce the demand on system resources, information about the frame energies in the averaging segment 210 can be stored in a packed form. Each frame energy is processed prior to storage in the static memory buffer 152.

Figure 4:
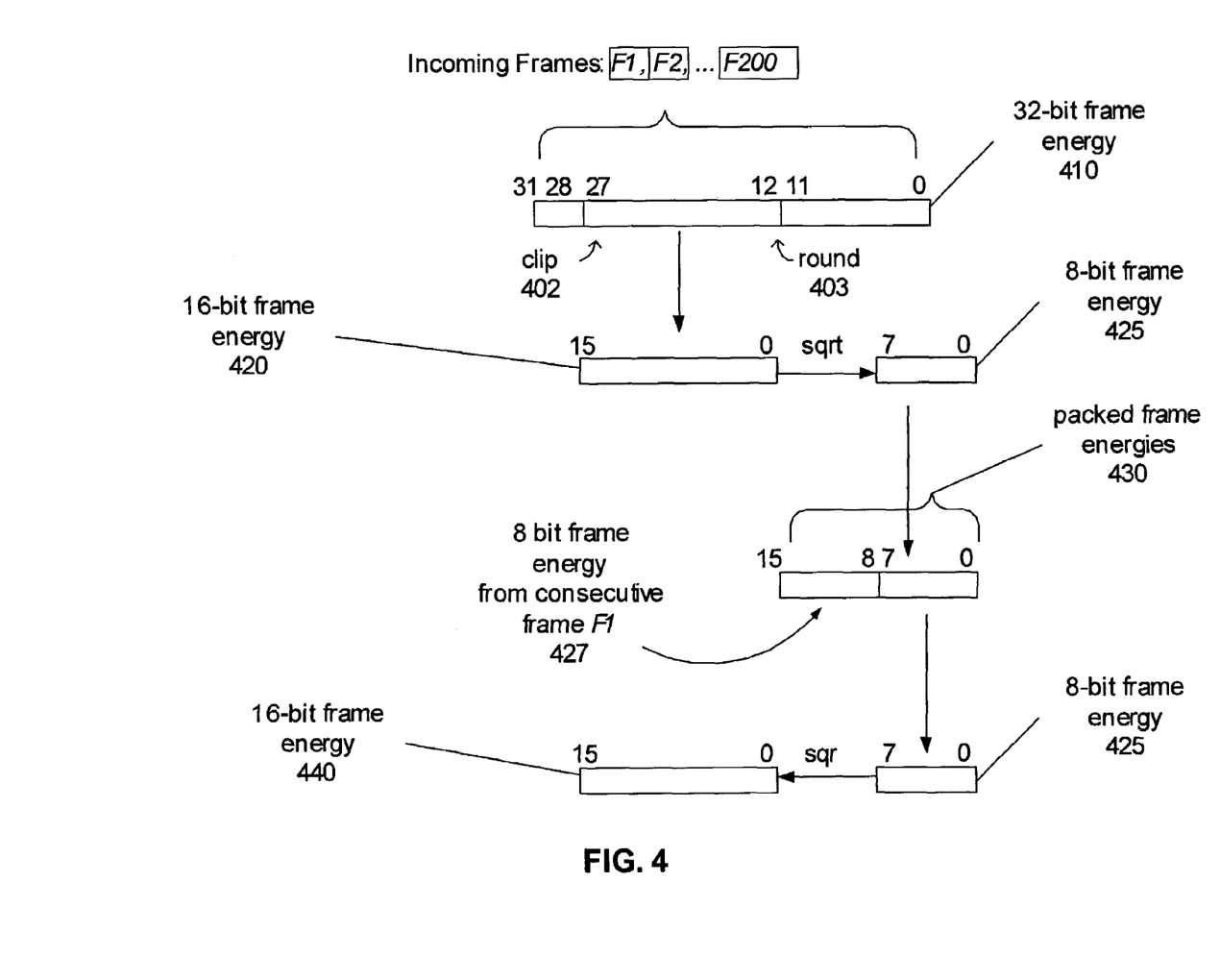
FIG. 4 is a schematic of a method for storing information about frame energies.

Referring to FIG. 4, information about the signal frame F2 is initially computed as a 32-bit value 410. Since very low frame energies may not be of interest in the context of RX-AVC module 150, and differentiation of high-level energies may not improve performance, 16 significant bits 420 are extracted from the 32-bit value 410 by clipping 402 and truncating 403 the excessive bits. If the frame energy exceeds a certain threshold, the energy is stored as the maximum 16-bit value. For example, bits of the 32-bit value 410 to the right of the 16 significant bits are rounded. The result is a 16-bit value 420 that is indicative of the frame energy.

In the example depicted in FIG. 4, the 16-bit value 420 is obtained from bits 27 to 12 of the 32-bit value 410. The location of the extracted 16-bit value 420 is tunable, e.g., such that in another case bits 25 to 10 are extracted, and so forth.

Further reduction in bit size of the frame energy information can be obtained by computing the square root of the remaining 16-bit value 420 and storing it as an 8-bit value 425. This 8-bit value 425 can be packed with an 8-bit value 427 similarly obtained for an adjacent frame, e.g., F1. These values can be stored in static memory. For processing, the values can be retrieved from static memory 152, and unpacked. Then each unpacked 8-bit value 425 can be squared to obtain the 16-bit processed value 440.

In other embodiments, the frame energies are stored for only a subset of signal frames, e.g., every second, or every third frame. The extent of information stored can be selected according to the size of each signal frame. For example, if each frame corresponds to 5 ms, sufficient performance may be obtained by storing information for a series that consists of every second, third, or fourth frame.

The stored information about the signal is analyzed to determine the presence of a signal for an intermittent sound with regular periodicity such as a drum beat in pop music. In some embodiments, the RX-AVC processor 151 uses an auto-correlation function 157 to detect such a periodic component not of interest that occurs simultaneously with human speech that is of interest.

Typically, the auto-correlation function 157 is defined as follows:

$$R[i] = \frac{N}{N-i} \sum_{frm=0}^{N-i} \cdot P[frm+i] \cdot P[frm], \; i >= 0, \quad (157)$$

where N is the averaging segment size, and $$P[frm] = \sum_{n=0}^{159} s[n]^2,$$

which denotes the average sample energy for the frame frm and s[n] is the level of a signal at a discrete time index within the frame. A 20 ms frame that includes information for sound sampled at 8 kHz has 160 time-indexed samples.

For example, the algorithm uses auto-correlations of 20 ms frame energies over an averaging segment 210 that is 4 seconds in duration. The frame energies for the averaging segment 210 are stored in static memory 152, e.g., as discussed above. The auto-correlation function 157 assesses the correlation between frame energies in the averaging segment 210 that are separated by a fixed number of frames, the separation corresponding to a period. The function is typically limited to searching for correlations that have a periodicity of 0.25 to 1 seconds (i.e., corresponding to 1 to 4 Hz). The latter range of periodicities, which can be characteristic of some musical rhythms, is identified as the search window 220 in FIG. 5.

Figure 6:
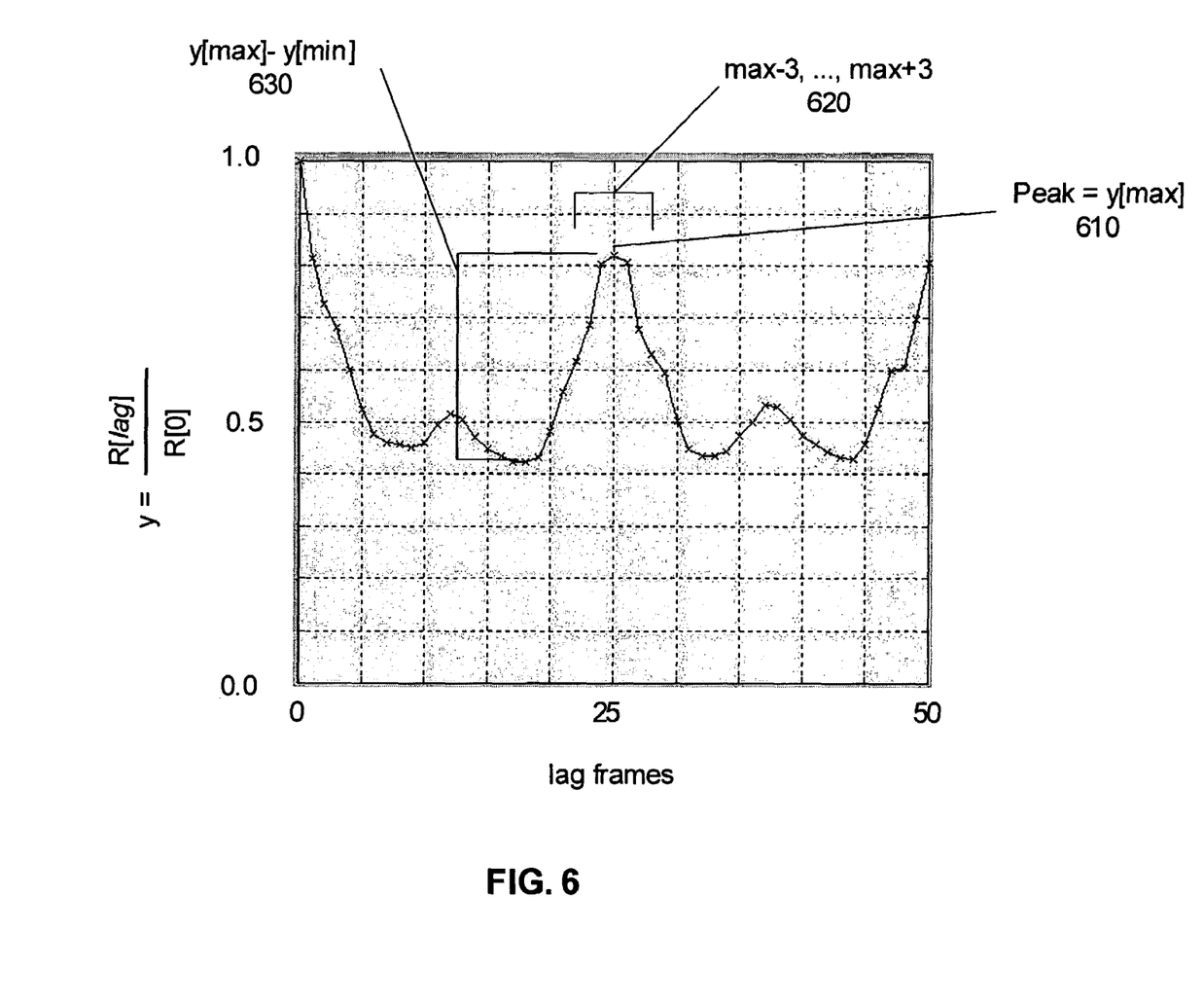
FIG. 6 is a graph of an auto-correlation function of the sound sample in FIG. 5.

The RX-AVC processor 151 evaluates peaks in the auto-correlation function 157 by the following exemplary criteria:

a. y[max]>Threshold_1;

b. $\sum_{i=max-3}^{max+3} (y[max] - y[i])^2 > \text{Threshold\_2};$ c. y[max]−y[min]>Threshold_3;

where y[i] is a normalized auto-correlation function (R[i]/R[0]);

max=$\arg_i \max\{y[i]\}$, i=13, . . . ,48; and min=$\arg_i \min\{y[i]\}$, i=13, . . . ,48. Referring to FIG. 6, the peak height 630 that is evaluated with respect to Threshold_3 is depicted as is the range 620 that is used to in the evaluation of Threshold_2.

Frame periodicities of 13 to 48 are analyzed in this example as these correspond to the 0.25 to 1 second periodicity described above if 20 ms frames are used.

The thresholds, Threshold_1, Threshold_2, and Threshold_3, can be determined empirically or can be set by other algorithms. For example, Threshold_1, Threshold_2, and Threshold_3 can be set to 0.70, 0.0625, and 0.25 respectively, as these parameters have been found to characterize the auto-correlation peaks of rhythmic music. Use of the auto-correlation function and tuning of the thresholds can facilitate detection of periodicities that are not perfectly regular. Hence, such detectable, imperfect periodicities are considered periodic herein.

The periodic signals detected by the RX-AVC processor 151 are periodic in the frequency domain of about 0.3 Hz to 6 Hz, or about 1 Hz to 4 Hz and do not correspond to musical or verbal pitch as would be detected in shorter time analysis. Such periodic signals can be produced by a musical instrument such as a percussion instrument. In addition, any musical instrument that produces a defined pitch can still be detected by the module if it is played in a rhythmic manner, e.g., a manner having repetitive noise bursts.

Figure 5:
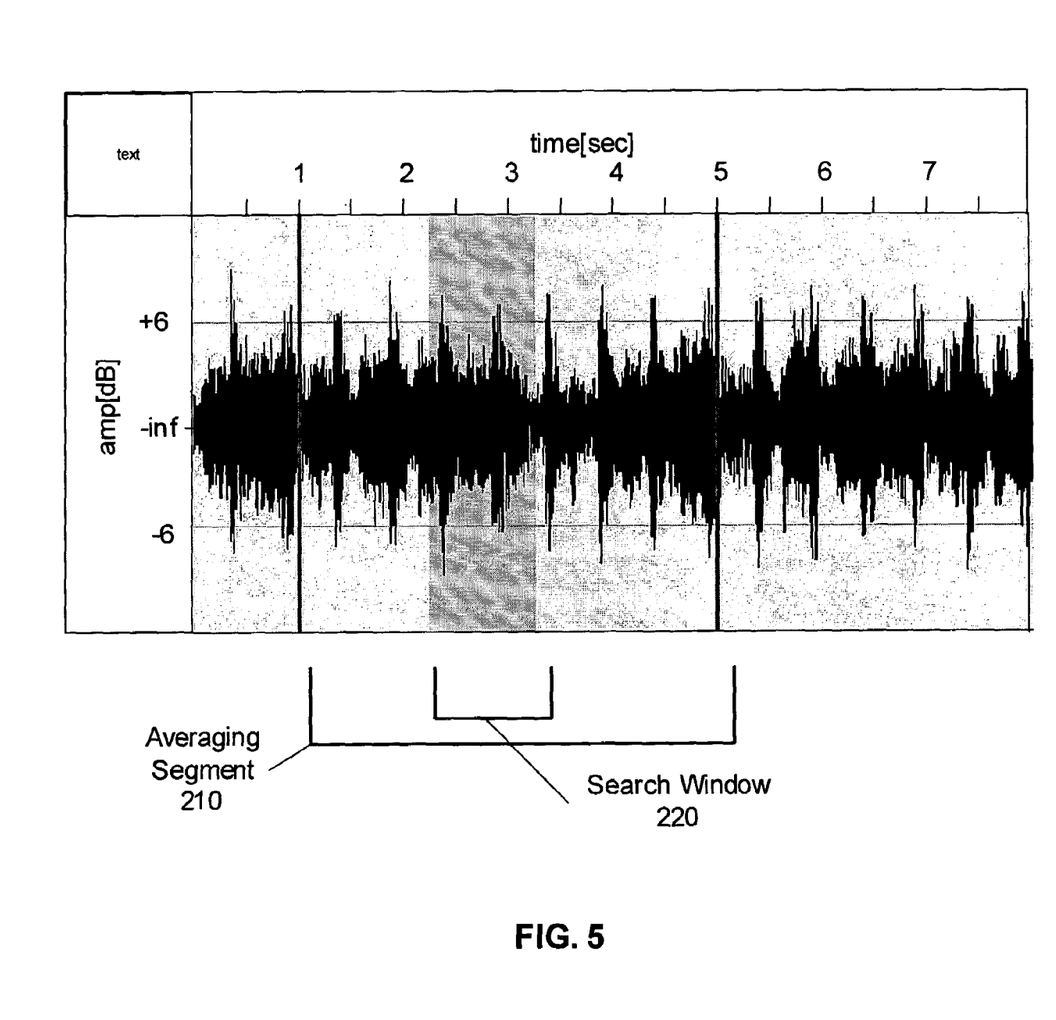
FIG. 5 is a graph of the amplitude of pop music sampled at 8 KHz.

Referring to the example in FIG. 5, a signal that includes pop music with a drum beat that has a period of 0.5 seconds was sampled at 8 KHz. The averaging segment 210 used by the module was 4 seconds in duration, and the auto-correlation function 157 searched for periodic signals in a search window of 0.25 to 1.0 seconds, i.e., between 1 Hz and 4 Hz. The peak of the auto-correlation function 157 indicates the beat period. The normalized auto-correlation function for the averaging segment 210 shown in FIG. 5 is graphed in FIG. 6. The peak of the function 610 is at 25 frames of 20 ms, which corresponds to a beat period of 0.5 seconds.

When the RX-AVC processor 151 detects a periodic component to the signal as described above, the module 150 triggers a signal modulator to alter the signal in order to improve the perception and/or interpretation of a component of interest, e.g., human speech.

In some embodiments, the modulator is the DRC 155. The DRC 155 can compress the dynamic range of the signal based on the level of noise, drc_noise_estimate, which is computed based on the VAD 140 and the RX-AVC 150. The level of noise can be sampled as set forth by the pseudocode in Table 1.

TABLE 1

| Pseudo-code for Noise Determination |
| --- |
| 1. update_noise_flag1 = FALSE |
| 2. If NOT (VAD_trigger) → update_noise_flag1 = TRUE |
| 3. update_noise_flag2 = FALSE |
| 4. If (rhythm_detect) → update_noise_flag2 = TRUE |
| 5. If (update_noise_flag1 = TRUE) → update drc_noise_estimate with current_energy_estimate |
| 6. Else If (tne_r_update_flag = TRUE) → update drc_noise_estimate with averaged_energy_estimate |

The VAD module 140 can be configured to evaluate each noise frame for non-periodic noise by detecting stationarity and non-tonality in the near-end signal 128 as an indication of random noise. Random noise can include Gaussian noise incurred during transmission. Typically, the VAD module 140 activates a trigger, VAD_trigger, when it perceives a signal of interest.

When the VAD module 140 does not perceive a signal of interest, the VAD module 140 causes the noise estimator 156 to update the drc_noise_estimate value. For example, if the signal level is less than a certain threshold, or if the signal is stationary or non-tonal, the VAD indicator, VAD_trigger, is not activated. This state (NOT VAD_trigger) activates the update_noise_flag1 flag (Table 1, line 2). As a result, drc_noise_estimate, is updated with the current energy estimate current_energy_estimate (Table 1, line 5). The noise level can be updated as follows:

$$drc\_noise\_estimate = \alpha * drc\_noise\_estimate + (1-\alpha) * current\_energy\_estimate,$$

where $\alpha$ is a smoothing constant.

The VAD module 140 may be unable to discriminate between a periodic signal component not of interest, such as rhythmic music, and a component of interest, such as speech. When a periodic signal component is detected, the RX-AVC processor 151 provides a second noise estimate that overrides the VAD noise estimate. For example, when the processor 151 detects a periodic component (Table 1, line 4), it triggers the update_noise_flag2, which causes the noise estimate drc_noise_estimate to be overwritten by averaged_energy_estimate, the averaged frame energies from the interval between two consecutive beats (Table 1, line 6). The frames that are used for this averaging can be from the middle of the averaging segment 210, e.g., two seconds prior to the decision instant. This value for the noise reflects the level of ambient noise caused by a periodic component such as music more accurately than the VAD noise estimate current_energy_estimate, which does not average energy levels across a full period of the periodic component.

Different steps of the noise determination routine as set forth in Table 1 can be run with different frequencies. The RX-AVC processor 151, for example, can evaluate the averaging segment 210 at regular intervals of about 0.25 seconds. Relative to continuous cycling, such an evaluation frequency reduces the amount of processing time required without impairing detection. Each evaluation includes resetting the update_noise_flag2 (Table 1, line 3), and re-evaluating the updated averaging segment 210 for rhythm (Table 1, line 4). In contrast, the VAD 140 can evaluate each frame for noise.

The above-described exemplary configuration can be used in a handheld telephone which enhances the reproduction of sound from a signal if it detects rhythmic music locally.

In addition to those described above, a number of different embodiments can be used to processing signals in response to locally detected sound in order to improve communications.

In some embodiments, the noise determination routine can include estimating noise levels from intervals of the signal which include a periodic component, but which are free of a second component, e.g., human speech. Speech recognition algorithms can be interfaced with the RX-AVC 150 to identify such intervals.

Further, a variety of ambient noises can be detected by the RX-AVC module 150, such as rhythmic music and other periodic background sounds.

In other embodiments, the module can include a pitch detection routine. The module can be programmed or trained to discriminate between sounds that have a pitch and/or timbre of a voice and sounds that have a pitch and/or timbre of a musical instrument.

Any of a variety of methods can be used to identify the periodic component. The methods can search for periodic or approximately periodic elements in the time domain or in the frequency domain of the signal. For example, Fourier transforms can be applied to the sequence of frame energies to identify recurring signals in the frequency domain.

Any of a variety of methods can be used to make the far-end signal 106 more human-interpretable when it is rendered as sound. For example, the near-end device can be triggered to generate anti-noise which comprises sound waves that cancel periodic components of the ambient noise.

Further, the techniques may be implemented in hardware, software, or a combination of the two in order to analyze digital or analog signals.

The techniques described here are also not limited to telephones, or the exemplary configuration described above; they may find applicability in any computing or processing environment for communications. For example, desktop computers linked to a computer network can be used to exchange sound communications that include human speech and ambient noise. Typically, each device may include a sound input device, such as a microphone, and a sound output device, such as a loudspeaker.

Still other implementations are also within the scope of the claims.

What is claimed is:

1. A method comprising:
   at a first device, receiving from a remote device a signal that comprises human-interpretable audio information;
   detecting sound at the first device;
   analyzing the detected sound to determine if an intermittent component is present; and
   if the intermittent component is present, altering the signal so that the audio information is more easily human-interpretable when the signal is converted to sound.

2. The method of claim 1 in which the human-interpretable audio information comprises speech.

3. The method of claim 1 in which the analyzing discriminates the intermittent component from speech.

4. The method of claim 1 in which the detecting comprises storing information about the levels of the detected sound during a series of time intervals, and
   the analyzing comprises evaluating the stored information to determine if the intermittent component is present.

5. The method of claim 4 in which the analyzing comprises comparing a first subset of the levels to a second subset of the levels, each subset including levels that correspond to regularly spaced time intervals, the first and second subsets having different regular spacings.

6. The method of claim 4 in which the analyzing comprises determining if a parameter of an auto-correlation function applied to the stored information satisfies a criterion.

7. The method of claim 4 in which the stored information abbreviates at least some information for high level and low levels of the signal during the time intervals.

8. The method of claim 1 in which the first device uses a wireless connection to receive the signal.

9. The method of claim 1 in which the dynamic range of the signal is altered to render the audio information more easily human-interpretable when the signal is performed.

10. The method of claim 9 in which the dynamic range of the signal is altered as a function of an estimate of non-periodic noise when the intermittent component is not detected and an estimate of periodic noise when the intermittent component is detected.

11. The method of claim 10 further comprising analyzing levels of the signal for an interval corresponding to at least one period of the intermittent component to generate the estimate of periodic noise.

12. The method of claim 11 in which the intervals correspond to approximately one period of the intermittent component.

13. The method of claim 1 in which the signal is altered to increase the amplitude of sound generated from the signal when the signal is converted to sound.

14. The method of claim 1 in which the audio component comprises music.

15. The method of claim 1 further comprising rendering the altered signal as sound.

16. A method comprising:
at a device, receiving a signal that comprises audio information;
detecting sound at the device;
storing values related to energy or amplitude of the detected sound, each of the values corresponding to an interval of the detected sound;
analyzing the values to determine if an intermittent component is present;
altering the signal if the intermittent component is determined to be present; and
rendering the altered signal as sound.

17. The method of claim 16 in which the audio signal is received in a digital format.

18. The method of claim 16 in which the altering includes compressing the dynamic range of the signal.

19. The method of claim 18 in which the dynamic range of the signal is altered as a function of an estimate of non-periodic noise when the intermittent component is not detected and an estimate of periodic noise when the intermittent component is detected.

20. The method of claim 16 in which the analyzing includes comparing a first subset of the levels to a second subset of the levels, each subset including levels that correspond to regularly spaced time intervals, the first and second subsets having different regular spacings.

21. The method of claim 16 in which each of the values is modified prior to storage to remove information for bits of the value that correspond to high values and for bits of the value that correspond to low values.

22. The method of claim 21 in which each of the values is stored in a packed format and unpacked for the analyzing.

23. A device comprising:
a receiver, configured to receive a signal representing audio information from a wireless transmission;
a signal modulator, configured to alter the signal in response to a noise estimate;
a sound input unit that detects sound at the device; and
a detector, configured to analyze sound, detected by the sound input unit, for an intermittent component of regular periodicity, generate a noise estimate for the intermittent component when the intermittent component is detected, and communicate the noise estimate to the signal modulator.

24. The device of claim 23 wherein the sound input unit comprises a microphone.

25. The device of claim 23 in which the signal modulator alters the dynamic range of the signal as a function of the noise estimate.

26. The device of claim 23 in which the signal detector comprises:
a memory store for storing information about levels of the signal during a series of time intervals; and
a processor configured to analyze the stored information for the intermittent component.

27. The device of claim 23 in which the processor is configured to (1) compare a first subset of the levels to a second subset of the levels, each subset including levels that correspond to regularly spaced time intervals, the first and second subsets having different regular spacings; and (2) generate the noise estimate for the intermittent component if the first and second subset satisfy a rule.

28. The device of claim 23 in which the processor is configured to apply an auto-correlation function to the stored information, and generate the noise estimate for the intermittent component if a parameter of the auto-correlation function satisfies a criterion.

29. The device of claim 23 in which the information about levels of the signal is stored in a packed format.

30. The device of claim 23 in which the information about levels of the signal is modified such that only information about a middle range of signal levels is retained.

31. A device comprising:
a memory store for storing information about levels of a signal received from a remote location during a series of time intervals, wherein the signal represents sound at the remote location; and
a processor, configured to modulate the signal to increase the amplitude of certain audio information in the received signal if it is determined that an intermittent component is present in sound detected at the device as determined from the levels of the signal stored in the memory store.

32. The device of claim 31 in which the processor alters the dynamic range of the received signal as a function of a noise estimate for the sound at the device.

33. The device of claim 32 in which the dynamic range of the signal is altered as a function of an estimate of non-periodic noise when it is determined that the intermittent component is not present and an estimate of periodic noise when it is determined that the intermittent component is present.

* * * * *